United States Patent
Pearlstein et al.

(10) Patent No.: US 10,170,297 B2
(45) Date of Patent: Jan. 1, 2019

(54) COMPOSITIONS AND METHODS USING SAME FOR FLOWABLE OXIDE DEPOSITION

(71) Applicant: AIR PRODUCTS AND CHEMICALS, INC., Allentown, PA (US)

(72) Inventors: Ronald Martin Pearlstein, San Marcos, CA (US); Daniel P. Spence, Carlsbad, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 827 days.

(21) Appl. No.: 14/457,397

(22) Filed: Aug. 12, 2014

(65) Prior Publication Data
US 2015/0056822 A1  Feb. 26, 2015

Related U.S. Application Data

(60) Provisional application No. 61/868,632, filed on Aug. 22, 2013.

(51) Int. Cl.
| | |
|---|---|
| *C09D 5/00* | (2006.01) |
| *H01L 21/02* | (2006.01) |
| *C23C 16/40* | (2006.01) |
| *C23C 16/452* | (2006.01) |

(52) U.S. Cl.
CPC .......... *H01L 21/02164* (2013.01); *C09D 5/00* (2013.01); *C23C 16/401* (2013.01); *C23C 16/402* (2013.01); *C23C 16/452* (2013.01); *H01L 21/02126* (2013.01); *H01L 21/02211* (2013.01); *H01L 21/02216* (2013.01); *H01L 21/02271* (2013.01); *H01L 21/02282* (2013.01)

(58) Field of Classification Search
CPC ...... C09D 183/02; C09D 5/00; C23C 16/401; C23C 16/402; C07G 77/26; H01L 21/02164
See application file for complete search history.

(56) References Cited

U.S. PATENT DOCUMENTS

| | | | |
|---|---|---|---|
| 3,734,019 A * | 5/1973 | Rentz ................ | F42D 3/00 102/275.6 |
| 4,828,131 A | 5/1989 | Strubel | |
| 5,728,758 A * | 3/1998 | Smith .................. | C08J 7/047 524/261 |
| 6,077,356 A | 6/2000 | Bouchard | |
| 6,526,824 B2 | 3/2003 | Chase et al. | |
| 6,592,980 B1 * | 7/2003 | MacDougall .......... | C08L 53/00 106/14.13 |
| 7,074,690 B1 | 7/2006 | Gauri et al. | |
| 7,124,913 B2 | 10/2006 | Birtcher et al. | |
| 7,261,118 B2 | 8/2007 | Birtcher et al. | |
| 7,498,273 B2 | 3/2009 | Mallick et al. | |
| 7,582,555 B1 | 9/2009 | Lang et al. | |
| 7,741,773 B2 | 6/2010 | Mahmood et al. | |
| 7,888,233 B1 | 2/2011 | Gauri et al. | |
| 7,915,131 B2 | 3/2011 | Nakagawa et al. | |
| 7,915,139 B1 | 3/2011 | Lang et al. | |
| 8,227,395 B2 | 7/2012 | Zhang et al. | |
| 8,481,403 B1 | 7/2013 | Gauri et al. | |
| 8,580,697 B1 | 11/2013 | Lang et al. | |
| 8,685,867 B1 | 4/2014 | Danek et al. | |
| 9,447,287 B2 * | 9/2016 | Xiao .................... | C07F 7/0896 |
| 2003/0224156 A1 | 12/2003 | Kirner et al. | |
| 2006/0058487 A1 * | 3/2006 | Rantala .................. | C08G 77/50 528/33 |
| 2006/0228903 A1 * | 10/2006 | McSwiney ............ | C23C 16/308 438/778 |
| 2010/0164057 A1 | 7/2010 | Hunks et al. | |
| 2010/0252917 A1 * | 10/2010 | Karkkainen ........... | C08G 77/52 257/629 |
| 2010/0304313 A1 * | 12/2010 | Zhang ................... | G03F 7/0048 430/432 |
| 2012/0161405 A1 | 6/2012 | Mohn et al. | |
| 2013/0180215 A1 | 7/2013 | Xiao et al. | |
| 2013/0230987 A1 | 9/2013 | Draeger et al. | |
| 2013/0243968 A1 * | 9/2013 | Xiao ....................... | C09D 5/00 427/535 |
| 2015/0056822 A1 * | 2/2015 | Pearlstein ............ | C23C 16/401 438/790 |

FOREIGN PATENT DOCUMENTS

| | | |
|---|---|---|
| EP | 1389746 | 2/2004 |
| JP | 10298289 | 11/1998 |
| JP | 2004067435 | 3/2004 |
| JP | 2004078217 | 3/2004 |
| JP | 2004134738 | 4/2004 |
| JP | 2009040874 | 2/2009 |
| JP | 2010047803 | 3/2010 |
| JP | 2011021169 | 2/2011 |

OTHER PUBLICATIONS

G. Vazquez, et al, "Surface Tension of Alcohol + Water from 20 to 50 C", J. Chem Eng Data, 1995, 611-614.
W.S. Bonnell, et al, "Surface Tension of Ethyl Alcohol-Water Mixtures", Industrial and Engineering Chemistry, 1940, 532-534.
"Surfynol 61 Surfactant", Air Products and Chemicals, Inc., Publication No. 120-9936, 1999.

* cited by examiner

*Primary Examiner* — David M Brunsman
(74) *Attorney, Agent, or Firm* — Rosaleen P. Morris-Oskanian; Michael K. Boyer; Joseph D. Rossi

(57) ABSTRACT

Described herein are compositions or formulations for forming a film in a semiconductor deposition process, such as without limitation, a flowable chemical vapor deposition of silicon oxide. Also described herein is a method to improve the surface wetting by incorporating an acetylenic alcohol or diol surfactant such as without limitation 3,5-dimethyl-1-hexyn-3-ol, 2,4,7,9-tetramethyl-5-decyn-4,7-diol, 4-ethyl-1-octyn-3-ol, and 2,5-dimethylhexan-2,5-diol, and other related compounds.

3 Claims, No Drawings

COMPOSITIONS AND METHODS USING SAME FOR FLOWABLE OXIDE DEPOSITION

CROSS-REFERENCE TO RELATED APPLICATIONS

This patent application claims the priority benefit of provisional patent application U.S. Ser. No. 61/868,632, entitled "Compositions and Methods Using Same for Flowable Oxide Deposition" filed Aug. 22, 2013, which is incorporated herein by reference in its entirety.

BACKGROUND OF THE INVENTION

Described herein is a process for the fabrication of an electronic device. More specifically, described herein are compositions or formulations for forming a film that are used for a hydrolyzable organosilane precursor film formation in a semiconductor deposition process, such as without limitation, in a flowable chemical vapor deposition of silicon oxide.

Alkoxysilane compounds are useful as precursors for silicon-containing films (such as silicon oxide films) deposited by controlled hydrolysis and condensation reactions. Such films can be deposited onto a substrate, for example, by applying a mixture of water and alkoxysilanes, optionally with solvent and/or other additives such as surfactants and porogens, onto a substrate. Typical methods for the application of these mixtures include, without limitation, spin coating, dip coating, spray coating, screen printing, co-condensation, and ink jet printing. After application to the substrate and upon application of one or more energy sources such as, without limitation thermal, plasma, and/or other sources, the water within the mixture can react with the alkoxysilanes to hydrolyze the alkoxide and/or aryloxide groups and generate silanol species, which further condense with other hydrolyzed molecules and form an oligomeric or network structure.

Vapor deposition processes using water and a silicon containing vapor source for flowable dielectric deposition (FCVD) have been described, for instance, in U.S. Pat. Nos. 8,481,403; 8,580,697; 8,685,867; US 2013/0230987 A1; U.S. Pat. No. 7,498,273; U.S. Pat. No. 7,074,690; U.S. Pat. No. 7,582,555; U.S. Pat. No. 7,888,233; and U.S. Pat. No. 7,915,131. Since the Si—C bond is relatively inert towards reaction with water, the resultant network may be beneficially functionalized with organic functional groups which impart desired chemical and physical properties to the resultant film. For example, the addition of carbon to the network may lower the dielectric constant of the resultant film.

U.S. Publ. No. 2010/0164057 ("the '057 Publication") discloses a full fill trench structure comprising a microelectronic device substrate having a high aspect ratio trench therein and a full filled mass of silicon dioxide in the trench, wherein the silicon dioxide is of a substantially void-free character and has a substantially uniform density throughout its bulk mass. Also described in the '057 Publication is a process for manufacturing a semiconductor product involving use of specific silicon precursor compositions for use in full filling a trench of a microelectronic device substrate, in which the silicon dioxide precursor composition is processed to conduct hydrolysis and condensation reactions for forming the substantially void free and substantially uniform density silicon dioxide material in the trench. The fill process may be carried out with a precursor fill composition including silicon and germanium, to produce a microelectronic device structure including a $GeO_2/SiO_2$ trench fill material. A suppressor component, e.g. methanol, may be employed in the precursor fill composition, to eliminate or minimize seam formation in the cured trench fill material.

U.S. Pat. No. 8,227,395 ("the '395 patent") discloses the use of acetylenic alcohols to reduce defects in patterned semiconductor devices being processed in aqueous rinses.

U.S. Pat. No. 7,741,773 ("the '773 patent") disclosed the addition of an acetylenic or other surfactant in a sol-gel formulation for coating by printing or other liquid application means to improve wetting of the substrate and filling irregularities in the surface.

US Publ. No. 2012/0161405 ("the '405 Publication") teaches that solvents and other surfactants may be used in flowable oxide vapor deposition processes with the benefit of compatibilizing (increasing miscibility of precursors). Examples of surfactants taught include alcohols (generically) and specifically ethylene glycol and polyethylene glycol. The '405 Publication, however, does not teach the use of acetylenic alcohols nor acetylenic diols, nor does it teach the benefits of wetting hydrophobic surfaces or preventing de-wetting of surfaces in trenches or on flat surfaces.

One problem that is encountered in the flowable chemical vapor deposition process (FCVD) is incomplete wetting of the substrate, which could lead to non-uniform substrate coverage or incomplete filling of narrow lines, gaps or vias. Further, another problem encountered in the FCVD process is a relatively slow rate of deposition, since certain surfactants may reduce initiation time and increase deposition rate by enabling capillary condensation. While the prior art has used alcohol-based surfactants such as ethanol in FCVD processes, these surfactants have been shown to be ineffective for use in this application due to incomplete wetting.

BRIEF SUMMARY OF THE INVENTION

The compositions or formulations described herein overcome the problems of the prior art by adding a volatile surfactant(s) which improves one or more of the following: rate of deposition, filling of narrow features (such as narrow lines, gaps or vias) within the substrate, density of the film deposition, and combinations thereof. Also described herein is a method to improve the surface wetting by incorporating a volatile surfactant or wetting agent to the film forming composition or formulation. Alcohols, such as 2-propanol, are also known to act as wetting agents, and have been used in the prior art for these processes. The method described herein differs from other surfactants used in the art because the surfactants described herein are more suitable as a surfactant, wetting agent, or both for film forming formulations and methods comprising same. More specifically, the surfactants described herein, are acetylenic alcohols and diols, such as 3,5-dimethyl-1-hexyn-3-ol, 2,4,7,9-tetramethyl-5-decyn-4,7-diol, 4-ethyl-1-octyn-3-ol, 2,5-dimethyl-hexan-2,5-diol, and combinations thereof, when used in a film forming formulation overcome the problems in the prior art with alcohol-based surfactants such as incomplete wetting. In certain aspects, the surfactants described herein can be premixed with other volatile components for the FCVD process or delivered to the deposition chamber separately as a vapor (at elevated temperature and/or reduced pressure) or as a mist, aerosol or liquid. The formulations described herein may be used in a process to deposit a dielectric film by using techniques known in the art. The formulations can be pre-mixed compositions, or pre-mixtures (mixed before being used in the deposition process), or in-situ mixtures (mixed during the deposition process). Thus, in this disclosure the terms "mixture", "formulation", and "composition" are interchangeable.

Specifically, in one embodiment, described herein is a formulation comprising:

(a) an organosilane precursor having a formula I comprising:

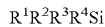

$$R^1R^2R^3R^4Si \qquad \text{I.}$$

wherein $R^1$, $R^2$, $R^3$, and $R^4$ are each independently selected from a hydrogen atom; a halogen atom; a $C_1$-$C_{12}$ linear or branched alkyl group; a $C_2$-$C_{12}$ alkenyl group; a $C_2$-$C_{12}$ alkynyl group; a $C_3$-$C_{12}$ aryl group; a $C_3$-$C_{12}$ cycloalkyl group; a $C_1$-$C_{12}$ alkoxy group; a $C_5$-$C_{12}$ aryloxy group; a $C_1$ to $C_{12}$ acyloxy group; a $C_5$ to $C_{12}$ aroyloxy; an isocyanato group; an amino group having the formula $NR^5R^6$ wherein $R^5$ and $R^6$ are independently selected from: a hydrogen atom; a $C_1$-$C_6$ linear or branched alkyl group; a $C_3$ to $C_{12}$ cycloalkyl group; and a $C_3$-$C_{12}$ aryl group wherein $R^5$ and $R^6$ are connected to form a ring or $R^5$ and $R^6$ are not connected to form a ring; and an alkoxysilylalkyl group having a formula selected from the group consisting of —$CH_2Si(OR^7)_nR^8{}_{3-n}$ and —$CH_2CH_2Si(OR^7)_nR^8{}_{3-n}$ wherein $R^7$ and $R^8$ are independently chosen from: a hydrogen atom, a $C_1$-$C_6$ linear or branched alkyl group, a $C_3$ to $C_{12}$ cycloalkyl group, and a $C_3$ to $C_{12}$ aryl group wherein $R^7$ and $R^8$ are connected to form a ring or $R^7$ and $R^8$ are not connected to form a ring and wherein in the alkoxysilylalkyl group n is a number ranging from 0 to 3 and wherein the first organosilane precursor contains at least two hydrolysable bonds selected from the group consisting of Si—H, Si—O and Si—N bond;

(b) optionally a second organosilane precursor selected from the group consisting of:

(1) a compound having a formula III comprising:

$$XSiR^1R^2R^3 \qquad \text{III.}$$

wherein X is a halogen atom selected from the group consisting of F, Cl, Br, and I; and $R^1$, $R^2$, and $R^3$ are each independently selected from a hydrogen atom; a halogen atom; a $C_1$-$C_{12}$ linear or branched alkyl group; a $C_2$-$C_{12}$ alkenyl group; a $C_2$-$C_{12}$ alkynyl group; a $C_3$-$C_{12}$ aryl group; a $C_3$-$C_{12}$ cycloalkyl group; a $C_1$-$C_{12}$ alkoxy group; a $C_5$-$C_{12}$ aryloxy group; a $C_1$ to $C_{12}$ acyloxy group; a $C_5$ to $C_{12}$ aroyloxy; an isocyanato group; and an alkoxysilylalkyl group having a formula selected from the group consisting of —$CH_2Si(OR^7)_nR^8{}_{3-n}$ and —$CH_2CH_2Si(OR^7)_nR^8{}_{3-n}$ wherein $R^7$ and $R^8$ are independently chosen from: a hydrogen atom, a $C_1$-$C_6$ a linear or branched alkyl group, a $C_3$ to $C_{12}$ cycloalkyl group, and a $C_3$ to $C_{12}$ aryl group wherein $R^7$ and $R^8$ are connected to form a ring or $R^7$ and $R^8$ are not connected to form a ring and wherein in the alkoxysilylalkyl group n is a number ranging from 0 to 3 and wherein at least one of substituents $R^1$, $R^2$, and $R^3$ within the second organosilane precursor forms a Si—H, Si-halogen, Si—O or Si—N bond; and (2) a compound having a formula IV comprising:

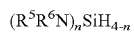

$$(R^5R^6N)_nSiH_{4-n} \qquad \text{IV.}$$

wherein $R^5$ and $R^6$ are independently selected from: a hydrogen atom; a $C_1$-$C_6$ linear or branched alkyl group; a $C_3$ to $C_{12}$ cycloalkyl group; and a $C_3$-$C_{12}$ aryl group wherein $R^5$ and $R^6$ are connected to form a ring or $R^5$ and $R^6$ are not connected to form a ring and n=1, 2, 3, or 4 and wherein at least a portion or all of the halogenation reagent reacts with the first organosilane precursor to provide the second organosilane precursor;

(c) optionally a catalyst; and (d) a surfactant selected from the group of compounds having the following formulae A through D:

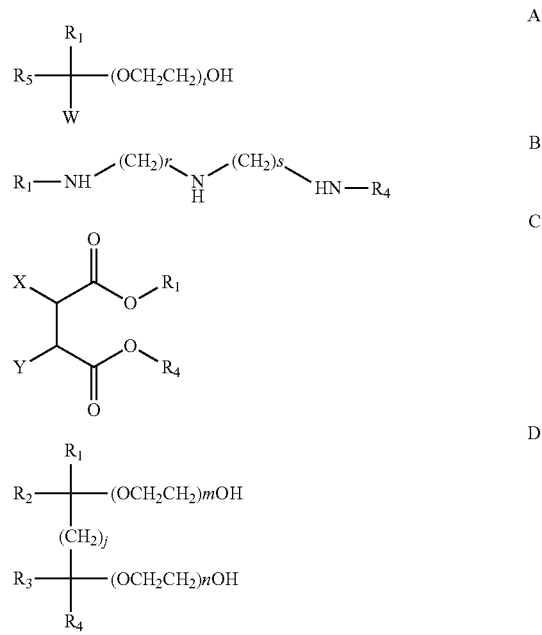

wherein $R_1$ and $R_4$ are each independently a linear or branched $C_3$-$C_6$ alkyl group; $R_2$ and $R_3$ are each independently a hydrogen atom or a linear or branched $C_1$-$C_5$ alkyl group; $R_5$ is a linear or a branched $C_1$-$C_6$ alkyl group; W is a hydrogen atom or an $C_2$-$C_{12}$ alkynyl group; X and Y are either a hydrogen atom or a hydroxyl group; m, n are each independently a number ranging from 0 to 4; r and s are each independently 2 or 3; and i is a number ranging from 0 to 2.

In certain embodiments, the above formulation further comprises a halogenation reagent. In these embodiments, a halogenation reagent having a formula II comprising:

$$R^9C(O)X \qquad \text{II.}$$

wherein X is a halogen atom and $R^9$ is selected from the group consisting of a hydrogen atom; a $C_1$-$C_{12}$ linear or branched alkyl group; a $C_3$-$C_{12}$ aryl group; a $C_3$-$C_{12}$ cycloalkyl group; a $C_1$-$C_{12}$ linear or branched acyl group; a $C_5$-$C_{12}$ aroyl group; and a $C_1$-$C_{12}$ linear or branched acyl halide group.

DETAILED DESCRIPTION OF THE INVENTION

Described herein is a film forming formulation comprising: an organosilane precursor, optionally a second organosilane precursor, optionally a catalyst; water (in a separate stream and also in vapor); and a surfactant which can be added to the formulation or in a separate stream. In certain embodiments, the film forming formulation is exposed to a protic reactant comprising, such as, without limitation, water or water vapor in a semiconductor deposition process. In one particular embodiment, the formulation described herein can be then used for depositing silicon dielectric films in conjunction with a protic reactant such as, without limitation water, or water vapor, for flowable vapor deposition processes. Also described herein are methods of generating the formulation, depositing the film, or both.

As described herein, the formulation comprises one or more organosilane precursor(s). The organosilane precursor(s) is present in the formulation an amount of from 50 weight % (wt %) or greater, 60 wt % or greater, 70 wt % or greater, 80 wt % or greater, or 90 wt % or greater. All wt % and parts per million (ppm) amount for each component add up to 100 wt % for the overall formulation.

In certain embodiments, the organosilane precursor, or a first organosilane precursor, has the following formula I:

$$R^1R^2R^3R^4Si \qquad \text{I.}$$

In formula I, substituents $R^1$, $R^2$, $R^3$, and $R^4$ are each independently selected from a hydrogen atom; a halogen atom; a $C_1$-$C_{12}$ linear or branched alkyl group; a $C_2$-$C_{12}$ alkenyl group; a $C_2$-$C_{12}$ alkynyl group; a $C_3$-$C_{12}$ aryl group; a $C_3$-$C_{12}$ cycloalkyl group; a $C_1$-$C_{12}$ alkoxy group; a $C_5$-$C_{12}$ aryloxy group; a $C_1$ to $C_{12}$ acyloxy group; a $C_5$ to $C_{12}$ aroyloxy; an isocyanato group; an amino group having the formula $NR^5R^6$ wherein $R^5$ and $R^6$ are independently selected from: a hydrogen atom; a $C_1$-$C_6$ linear or branched alkyl group; a $C_3$ to $C_{12}$ cycloalkyl group; and a $C_3$-$C_{12}$ aryl group wherein $R^5$ and $R^6$ are connected to form a ring or $R^5$ and $R^6$ are not connected to form a ring; and an alkoxysilylalkyl group having a formula selected from the group consisting of —$CH_2Si(OR^7)_nR^8_{3-n}$ and —$CH_2CH_2Si(OR^7)_nR^8_{3-n}$ wherein $R^7$ and $R^8$ are independently chosen from: a hydrogen atom, a $C_1$-$C_6$ linear or branched alkyl group, a $C_3$ to $C_{12}$ cycloalkyl group, and a $C_3$ to $C_{12}$ aryl group wherein $R^7$ and $R^8$ are connected to form a ring or $R^7$ and $R^8$ are not connected to form a ring and wherein in the alkoxysilylalkyl group n is a number ranging from 0 to 3. Further, in certain embodiments of the above Formula I, the first organosilane precursor comprises at least two hydrolysable bonds selected from the group consisting of Si—H, Si-halogen, Si—O and Si—N bond.

Examples of organosilane precursors or first organosilane precursors include, but are not limited to, methyltrimethoxysilane, methyltriethoxysilane, triethoxysilane, tetramethoxysilane, tetraethoxysilane, hexyltrimethoxysilane, isobutyltrimethoxysilane, isobutyltriethoxysilane, hexyltriethoxysilane, tert-butyltrimethoxysilane, tert-butyltriethoxysilane, ethyltrimethoxysilane, ethyltriethoxysilane, di(tert-butoxy)silane, di(tert-pentoxy)silane, tetrakisisocyanatosilane, bis(tert-butylamino)silane, diisopropylaminosilane, methyldiethoxysilane, hydrogensilsesquioxane, tert-butoxydisilane, diisopropylaminodisilane, hexaethoxydisilane, tris(tert-butoxy)silanol, tris(tert-pentoxy)silanol, tetramethylcyclotetrasiloxane, 1,1,1,4,4,4-hexamethoxy-1,4-disilabutane, 1-methyl-1,1,4,4,4-pentamethoxy-1,4-disilabutane, 1,1,1,4,4,4-hexaethoxy-1,4-disilabutane, 1-methyl-1,1,4,4,4-pentaethoxy-1,4-disilabutane, 1,1,1,3,3,3-hexamethoxy-1,3-disilapropane, 1-methyl-1,1,3,3,3-pentamethoxy-1,3-disilapropane, 1,1,1,3,3,3-hexaethoxy-1,3-disilapropane, 1-methyl-1,1,3,3,3-pentaethoxy-1,3-disilapropane, and combinations thereof.

In certain embodiments the formulation may further comprises a halogenation reagent. In these embodiments, a halogenation reagent having a formula II comprising:

$$R^9C(O)X \qquad \text{II.}$$

wherein X is a halogen atom and $R^9$ is selected from the group consisting of a hydrogen atom; a $C_1$-$C_{12}$ linear or branched alkyl group; a $C_3$-$C_{12}$ aryl group; a $C_3$-$C_{12}$ cycloalkyl group; a $C_1$-$C_{12}$ linear or branched acyl group; a $C_5$-$C_{12}$ aroyl group; and a $C_1$-$C_{12}$ linear or branched acyl halide group The formulation further comprises optionally a pre-catalyst additive which is a second organosilane precursor which can have either formula III or formula IV described herein. In embodiments wherein the second organosilane comprises a compound having formula III, the catalytically active species can be generated, for example, during a flowable vapor deposition process, may be an acid species such as, for example, a hydrogen halide. In embodiments wherein the second organosilane comprises a compound having formula IV, the catalytically active species can be generated, for example, during a flowable vapor deposition process may be an a basic species such as, for example, an amine.

In one embodiment, the second organosilane precursor is a compound having the following formula III.

$$XSiR^1R^2R^3 \qquad (III)$$

In formula III, substituents $R^1$, $R^2$, and $R^3$ are each independently selected from a hydrogen atom; a halogen atom; a $C_1$-$C_{12}$ linear or branched alkyl group; a $C_2$-$C_{12}$ alkenyl group; a $C_2$-$C_{12}$ alkynyl group; a $C_3$-$C_{12}$ aryl group; a $C_3$-$C_{12}$ cycloalkyl group; a $C_1$-$C_{12}$ alkoxy group; a $C_5$-$C_{12}$ aryloxy group; a $C_1$ to $C_{12}$ acyloxy group; a $C_5$ to $C_{12}$ aroyloxy; an isocyanato group; and an alkoxysilylalkyl group having a formula selected from the group consisting of —$CH_2Si(OR^7)_nR^8_{3-n}$ and —$CH_2CH_2Si(OR^7)_nR^8_{3-n}$ wherein $R^7$ and $R^8$ are independently chosen from: a hydrogen atom, a $C_1$-$C_6$ linear or branched alkyl group, a $C_3$ to $C_{12}$ cycloalkyl group, and a $C_3$ to $C_{12}$ aryl group wherein $R^7$ and $R^8$ are connected to form a ring or $R^7$ and $R^8$ are not connected to form a ring and wherein in the alkoxysilylalkyl group n is a number ranging from 0 to 3. Further, in the above Formula III, the second organosilane precursor contains at least one hydrolysable bond independently selected from the group consisting of Si—H, Si-halogen, Si—O and Si—N bond.

In one embodiment, the second organosilane precursor is a compound having the following formula IV:

$$(R^5R^6N)_nSiH_{4-n} \qquad (IV)$$

In formula IV, $R^5$ and $R^6$ are independently selected from: a hydrogen atom; a $C_1$-$C_6$ linear or branched alkyl group; a $C_3$ to $C_{12}$ cycloalkyl group; and a $C_3$-$C_{12}$ aryl group wherein $R^5$ and $R^6$ are connected to form a ring or $R^5$ and $R^6$ are not connected to form a ring and n=1, 2, 3, or 4.

Exemplary second organosilane precursors include, but not limited to, di-iso-propylaminosilane, di-sec-butylaminosilane, bis(diethylamino)silane, bis(ethylmethylamino)silane, bis(tert-butylamino)silane, bis(tert-amylamino)silane tris(dimethylamino)silane, tris(diethylamino)silane, tris(ethylmethylamino)silane, tetrakis(dimethylamino)silane, and tetrakis(diethylamino)silane.

In certain embodiments, the formulation further comprises a catalyst. Exemplary catalysts include, but are not limited to, HCl, HBr, HF, HI, a sulfonic acid, an amine, an imine, and combinations thereof.

In one particular embodiment, the formulation comprises compounds with formulae I, II, and III. In another particular embodiment, the formulation comprises compounds with formulae I and IV.

Throughout the description, the term "hydrolysable" denotes an organosilane contains a hydrolysable bond selected from a group consisting of Si—H, Si-halogen, Si—O and Si—N bond. The hydrolysable bond can react with a protic reactant to form Si—O—Si linkage in a flowable chemical vapor deposition, thus facilitating the formation of silicon oxide films.

In the formulae above and throughout the description, the term "alkyl" denotes a linear or branched functional group having from 1 to 12, 1 to 10, 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic group having from 3 to 12 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group In the formulae above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulae above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms.

In the formulae above and throughout the description, the term "alkoxy" denotes an alkyl group which has is linked to an oxygen atom (e.g., R—O) and may have from 1 to 12 or from 1 to 6 carbon atoms. Exemplary alkoxy groups include, but are not limited to, methoxy, ethoxy, propoxy, isopropoxy, butoxy, isobutoxy, sec-butoxy, tert-butoxy, pentoxy, tert-pentoxy, isopentoxy, neo-pentoxy, hexoxy, and 2-ethylhexoxy.

In the formulae above and throughout the description, the term "aryloxy" denotes an aryl group which has is linked to an oxygen atom (e.g., R—O) and may have from 1 to 12 or from 1 to 6 carbon atoms. Exemplary aryloxy groups include, but are not limited to, phenoxy, cresyloxy, 2-methylphenoxy, 3-methylphenoxy, 4-methylphenoxy, xylenoxy, p-hexylphenoxy.

In the formulae above and throughout the description, the term "acyloxy" denotes an acyl group which has is linked to an oxygen atom (e.g., R—O) and may have from 1 to 12 or from 1 to 6 carbon atoms. Exemplary acyloxy groups include, but are not limited to, acetoxy.

In the formulae above and throughout the description, the term "aroyloxy" denotes an aromatic acid radical which has is linked to an oxygen atom (e.g., R—O) and may have from 1 to 12 or from 1 to 6 carbon atoms. Exemplary aroyloxy groups include, but are not limited to, benzoyloxy, and napthoyloxy.

In the formulae above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In the formulae above and through the description, the term "isocyante group" means —N=C=O group bonded to silicon via a nitrogen atom.

In certain embodiments, one or more of the alkyl group, alkenyl group, alkynyl group, alkoxysilylalkyl group, alkoxy group, aryloxy, aroyloxy, aryl group, and/or aromatic group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, alkoxyalkyl group, alkoxy group, alkylaminoalkyl group, aromatic and/or aryl group in the formulae may be unsubstituted.

In certain embodiments, substituents $R^5$ and $R^6$ and/or substitutents $R^7$ and $R^8$ are linked in the above formula are linked to form a ring structure when $R^5$ and $R^7$ are not hydrogen. As the skilled person will understand, where $R^5$ and $R^6$ or $R^7$ and $R^8$ are linked together to form a ring, $R^5$ will include a bond (instead of a hydrogen substituent) for linking to $R^6$ and vice versa. Thus, in the example above $R^5$ may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring, or saturated, for example, an aryl ring. Further, in these embodiments, the ring structure can also be substituted or substituted. In other embodiments, substituent $R^5$ and $R^6$ or substituent $R^7$ and $R^8$ are not linked.

A flowable dielectric coating can be achieved by using a process similar to that known in the art such as those processes described in U.S. Pat. Nos. 7,888,233, 7,582,555, and U.S. Pat. No. 7,915,139B1. A substrate to be coated is placed into a deposition chamber. The temperature of the substrate may be controlled to be less than the walls of the chamber. The substrate temperature is held at a temperature below 100° C., preferably at a temperature below 25° C. and most preferably below 10° C. and greater than −30° C. The substrate optionally has features on it of a small size less than 100 μm in width preferably less than 1 μm in width and most preferably less than 0.5 μm in width. The aspect ratio (the depth to width ratio) of the features, if present, is greater than 0.1:1 and preferably greater than 1:1 and most preferably greater than 2:1. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

The deposition chamber may be kept at a pressure below atmospheric pressure (less than $10^5$ Pa), preferably below $10^4$ Pa and most preferably between 100 and 1000 Pa. A silicon precursor is added as a vapor into the chamber along with water vapor. The combined vapors should not condense on the walls of the chamber at the normal working pressure of the chamber, but can form a liquid film on the substrate and within features on the surface of the substrate.

In order to improve the wetting of this liquid film on the surface of the substrate, one or more surfactants having a formula (A) through (D) shown below is added to the chamber, film, film forming formulation or combinations thereof as a vapor, mist, aerosol or dispersion.

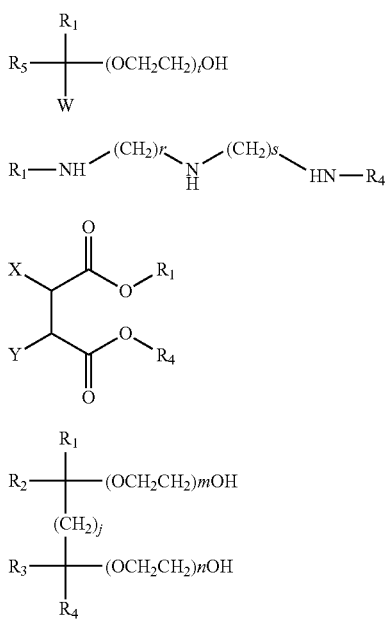

In each of the above formulae A through D, $R_1$ and $R_4$ are each independently a linear or branched $C_3$-$C_6$ alkyl group; $R_2$ and $R_3$ are each independently a hydrogen atom, a linear or branched $C_1$-$C_5$ alkyl group; $R_5$ is a linear or a branched $C_1$-$C_6$ alkyl group; W is a hydrogen atom or an $C_2$-$C_{12}$ alkynyl group; X and Y are either a hydrogen atom or a hydroxyl group; m, n are each independently a number ranging from 0 to 4; r and s are each independently 2 or 3; and i is a number ranging from 0 to 2. Examples of Formula A surfactants include, but are not limited to, 3,5-dimethyl-1-hexyn-3-ol or SURFYNOL® 61 provided by Air Products and Chemicals, Inc. of Allentown, Pa., the assignee of the present invention, and 2,6-dimethyl-4-heptanol provided by the Sigma-Aldrich Company of St. Louis, Mo. An example of a Formula B surfactant includes, but is not limited to, N,N'-bis(1,3-dimethylbutyl) ethylenediamine. An example of a Formula C surfactant includes, but is not limited to, diisopentyl tartrate or ENVIROGEM® AE03 provided by Air Products and Chemicals, Inc. of Allentown, Pa. An example of a Formula D surfactant includes, but is not limited to, 2,4,7,9-tetramethyl-4,7-decanediol or ENVIROGEM® AD01 provided by Air Products and Chemicals, Inc. of Allentown, Pa.

In one aspect, the surfactant(s) used herein are volatile. The term volatile as used herein means the surfactant exhibits a normal boiling point sufficient to be delivered to the substrate in the form of a gas or vapor, readily removed from the film in a subsequent cure step (if applicable), or combinations thereof. The surfactant(s) used herein has a normal boiling point of 400° C. or less, 300° C. or less, or 200° C. or less.

In another aspect, the surfactant in the method and formulation described herein has a certain surface tension such as a static surface tension measured in water at a temperature of 25° C. that allows it to sufficiently wet the surface of the substrate. Table I provides the static surface tension for various surfactants described herein and alcohol-based surfactants of the prior art (e.g., ethanol and isopropanol):

TABLE I

| Compound | Concentration in Water | Static Surface Tension is Water at 25° C. |
| --- | --- | --- |
| 2,4,7,9-tetramethyl-5-dodecyne-4,7-diol | 0.10% | 32.1 mN/m (1) |
| 2,5,8,11-tetramethyl-6-dodecyne-5,8-diol | 0.10% | 34.1 mN/m (1) |
| Ethanol | 5% | 55.7 mN/m (2) |
| Isopropanol | 5% | 49.6 mN/m (2) |
| Ethanol | 2.33% | 62.8 mN/m (3) |
| 3-4-dimethyl-1-hexyn-3-ol | 0.90% | 34.3 mN/m (4) |

(1) U.S. Pat. No. 8,277,395
(2) Vasquez, G., et al., Journal Chemical Engineering Data, 1995, Vol 40, pp. 611-14
(3) Bonnell, W. S., et al., Industrial Engineering Chemistry, 1940, Vol 32, pp. 532-34
(4) Surfynol ® 61 Surfactant Publication No. 120-9936 Air Products and Chemicals, Inc. 1999

The surfactant may be added either before, during or after the precursor and water vapor are being introduced into the chamber; or at any combination of these points in the process. In one embodiment of this invention, the surfactant is only introduced before the precursor and water vapor are introduced and its addition terminated shortly after the introduction of precursor vapor and water vapor into the deposition chamber. It is believed that the surfactant permits a thin, continuous film of the reactive mixture of precursor and water to coat the substrate and reduces the surface tension of this mixture permitting improved filling of surface features and more uniform coverage of open planar areas.

The flow rate of the surfactant into the chamber can be fixed or variable relative to the flow rate of the precursor and the water vapor. The volumetric flow rate can range from 0.005:1 relative to the precursor to 50:1 relative to the precursor, preferably from 0.1:1 to 5:1 and most preferably from 0.5:1 to 2:1.

The surfactant may be delivered to the deposition chamber as a separate stream, either as a liquid that passes through a heated vaporizer before being introduced into the chamber, as a finely dispersed mist or aerosol. The surfactant may also be introduced as a pre-mix in the formulation with either the precursor, the water vapor source (e.g., protic reagent) or both. The pre-mixed surfactant and precursor and the pre-mixed surfactant and water source may be in the form of a solution, an emulsion or as a suspension.

In a separate embodiment, the substrate may be coated with a thin layer of the surfactant before being introduced into the chamber. The formulations or reactions described above may be carried out directly in the storage and delivery vessel used to supply the formulations for the deposition process. Alternatively, these formulations may be produced in a bulk vessel, ideally under a dry, inert gas atmosphere. The bulk vessel may optionally be stirred and/or temperature controlled.

In one embodiment of the formulation described herein, the formulation is made via dynamic blending. The product stream may be directed into a mixing tank, a holding tank, a heated reactor or directly into a storage and delivery vessel used to transport the formulation described herein to a deposition system.

With regard to the later embodiment related to a storage and delivery vessel, the formulations containing one or more of the components comprised therein may be stored, transported and delivered in glass, plastic, or metallic containers or other suitable containers known in the art, such as the containers disclosed in the following U.S. Pat. Nos. 4,828, 131; 6,077,356; 6,526,824; 7,124,913; and 7,261,118, all of which are herein incorporated by reference in their entirety.

Plastic or glass lined metallic vessels or containers may also be used. Preferably, the material is stored and delivered from a hermetically sealed high purity stainless steel or nickel alloy vessel. Most preferably, the material is stored and delivered from a hermetically sealed high purity stainless steel or nickel alloy vessel equipped with a down tube and an outlet in communication with the vapor space of the vessel; allowing the product to be delivered either as a liquid from the downtube or as a vapor from the outlet connection in communication with the vapor phase. In the latter case, the down-tube may be optionally used to introduce a carrier gas into the vessel to promote the vaporization of the mixture. In this embodiment, the downtube and vapor outlet connections are equipped with high integrity packless valves. While delivery of the liquid is preferred to avoid partitioning of the components of this formulation described herein, it should be noted that the formulations of the present invention match the vapor pressure of the components closely enough to enable the formulation to be delivered as a vapor mixture. Stainless steel may preferably be chosen from UNS alloy numbers S31600, S31603, S30400, S30403, S31700, S31703, S31500, S31803, S32750, and S31254. Nickel alloys may preferably be chosen from UNS alloy numbers N06625, N10665, N06022, N10276, and N06007. Most preferably, the vessels are made from alloys S31603 or N06022, either uncoated, internally electro polished or internally coated with a fluoropolymer.

The formulations described herein can be used as the main deposition precursor may be used in a process to deposit a dielectric film by using techniques known in the art. The formulations can be pre-mixed mixtures, or pre-mixtures (mixed before being used in the deposition process), or in-situ mixtures (mixed during the deposition process). Thus, in this disclosure the terms "mixture" and "formulation" are interchangeable.

The formulations described herein can be used to provide a rapid and uniform deposition of a flowable silicon oxide film. The formulation described herein may be used with another reactant containing water and optional co-solvents, surfactants and other additives and deposited onto a substrate. Distribution or delivery of this reaction formulation may be achieved by direct liquid injection, spraying, dipping, co-condensation or centrifugal spin-coating. The formulation is then allowed to react until a solid film or body is obtained. The use of inert gas, vacuum, heat or external energy source (light, heat, plasma, e-beam, etc.) to remove unreacted volatile species, including solvents and unreacted water may follow to facilitate the condensation of the film. The formulations of the present invention may preferably be delivered to a substrate contained in a deposition chamber a process fluid such as without limitation, a gas phase, liquid droplets, mist, fog, aerosol, sublimed solid, or combination thereof with water and optionally co-solvents and other additives also added as a process fluid such as a gas, vapor, aerosol, mist, or combination thereof. Preferably, the formulation of the present invention condenses or dissolves into a condensed film on the surface of the substrate, which may advantageously be held at a temperature below that of the walls of the chamber. The co-mixed deposition precursor and catalyst of the present invention can react at a uniform rate on the surface of the substrate rendering the reaction products into a non-volatile film. Unreacted precursors, water and optional co-solvents and additives may then be removed by gas purge, vacuum, heating, addition of external radiation (light, plasma, electron beam, etc.) until a stable solid silicon-containing film is obtained.

WORKING EXAMPLES

Comparative Example 1: Use of Ethanol as Surfactant

A formulation containing 0.15 mL of cyclohexyltrimethoxysilane with 1000 parts per million weight (ppmw) chloride in the form of diethoxymethylchlorosilane was mixed with 1.5 milliliters (mL) of a 9% by weight mixture of water in ethanol and allowed to sit for approximately 25 minutes. A few drops of the mixture were put on a silicon wafer and using another silicon wafer as a squeegee spread uniformly and left to dry in the hood. It was witnessed that the uniform film had become non-uniform after drying in the hood and tended to "bead up".

Example 2: Use of Acetylenic Alcohol as Surfactant

To a 0.15 mL solution of cyclohexyltrimethoxysilane with 1000 ppmw chloride in the form of diethoxymethylchlorosilane was added 1.5 mL of a saturated SURFYNOL® 61 mixture with water (~9% water by weight). Spreads were made on silicon wafers by the same application method as mentioned above and dried in the hood. Films remained uniform after drying. This is in contrast with Comparative Example 1 wherein the ethanol was ineffective as a surfactant.

Comparative Example 3: Use of Ethanol as Surfactant 0.15 mL of isobutyltrimethoxysilane with 1000 ppmw chloride via in the form of diethoxymethylchlorosilane was mixed with 1.5 mL of a 9% by weight mixture of water in ethanol and allowed to sit for approximately 30 minutes. A few drops of the mixture were put on a silicon wafer and using another silicon wafer as a squeegee spread uniformly and left to dry in the hood. It was witnessed that the uniform film had become non-uniform after drying in the hood and tended to "bead up".

Example 4: Use of Acetylenic Alcohol as Surfactant

To a 0.15 mL solution of isobutyltrimethoxysilane with 1000 ppmw chloride via diethoxymethylchlorosilane was added 1.5 mL of a saturated SURFYNOL® 61 mixture with water (~9% water by weight). Spreads were made on silicon wafers by the same application method as mentioned above and dried in the hood. Films remained uniform after drying. By contrast to Comparative Example 3, the mixtures containing the acetylenic alcohol surfactant were more effective as a surfactant than the ethanol for the same formulation.

The invention claimed is:
1. A formulation consisting of:
(a) an organosilane precursor is selected from the group consisting of: methyltrimethoxysilane, methyltriethoxysilane, triethoxysilane, tetraethoxysilane, hexyltrimethoxysilane, isobutyltrimethoxysilane, isobutyltriethoxysilane, hexyltriethoxysilane, tert-butyltrimethoxysilane, tert-butyltriethoxysilane, ethyltrimethoxysilane, ethyltriethoxysilane, and combinations thereof;
(b) a second organosilane precursor selected from the group consisting of 1,1,1,4,4,4-hexamethoxy-1,4-disilabutane, 1-methyl-1,1,4,4,4-pentamethoxy-1,4-disilabutane, 1,1,1,4,4,4-hexaethoxy-1,4-disilabutane, 1-methyl-1,1,4,4,4-pentaethoxy-1,4-disilabutane, 1,1,1,3,3,3-hexamethoxy-1,3-disilapropane, 1-methyl-1,1,3,3,3-pentamethoxy-1,3-disilapropane, 1,1,1,3,3,3-hexaethoxy-1,3-disilapropane, 1-methyl-1,1,3,3,3-pentaethoxy-1,3-disilapropane, and combinations thereof;
(c) a catalyst selected from the group consisting of HCl, HBr, HF, HI, a sulfonic acid, an amine, an imine, and combinations thereof;
(d) a surfactant which is at least one selected from the group consisting of 3,5-dimethyl-1-hexyn-3-ol, 2,4,7,9-tetramethyl-5-decyn-4,7-diol, 4-ethyl-1-octyn-3-ol, 2,5-dimethylhexan-2,5-diol, and combinations thereof; and
(e) optionally, a halogenation reagent having a formula II comprising:

$$R^9C(O)X \qquad\qquad II.$$

wherein X is a halogen atom and $R^9$ is selected from the group consisting of a hydrogen atom; a $C_1$-$C_{12}$ linear or branched alkyl group; a $C_3$-$C_{12}$ aryl group; a $C_3$-$C_{12}$ cycloalkyl group; a $C_1$-$C_{12}$ linear or branched acyl group; a $C_5$-$C_{12}$ aroyl group; and a $C_1$-$C_{12}$ linear or branched acyl halide group.

2. The formulation of claim 1 wherein the surfactant is 3,5-dimethyl-1-hexyn-3-ol.

3. A formulation comprising hexyltrimethoxysilane; di-iso-propylaminosilane; an amine; and 3,5-dimethyl-1-hexyn-3-ol.

* * * * *